United States Patent [19]

Tanaka

[11] Patent Number: 5,541,936
[45] Date of Patent: Jul. 30, 1996

[54] DIAGNOSTIC CIRCUIT

[75] Inventor: Yasuharu Tanaka, Tokyo, Japan

[73] Assignee: NEC Corporation, Tokyo, Japan

[21] Appl. No.: 365,451

[22] Filed: Dec. 28, 1994

[30] Foreign Application Priority Data

Dec. 28, 1993 [JP] Japan .................................. 5-336927

[51] Int. Cl.$^6$ .................................................. G06F 11/00
[52] U.S. Cl. ............................................ 371/25.1; 395/800
[58] Field of Search ............................... 395/800, 183.01, 395/183.06; 365/201; 371/25.1, 15.1, 26

[56] References Cited

U.S. PATENT DOCUMENTS 5,043,990  8/1991  Doi et al. ................................ 371/68.1
5,361,230  11/1994  Ikeda et al. ............................. 365/194

FOREIGN PATENT DOCUMENTS 63-174141  7/1988  Japan.

Primary Examiner—Vincent P. Canney
Attorney, Agent, or Firm—Whitham, Curtis, Whitham & McGinn

[57] ABSTRACT

There is disclosed a diagnostic circuit which comprises, for each of a plurality of function blocks obtained by dividing a function circuit, an arithmetic circuit for accumulatively calculating bit data of all flipflops in each function clock at each operation clock, a register for storing the result of the calculation in the arithmetic circuit, and a circuit for outputting data of the register as the operation result read out from the function block. With this arrangement, it is possible to certainly diagnose a sequential change of flipflops caused by clocks. In addition, since the number of the reading-out and comparison of the operation results can be reduced in comparison with the prior art, the diagnosis time can be shortened, and the capacity of a correct value memory can be reduced.

2 Claims, 6 Drawing Sheets

DIAGNOSTIC CIRCUIT

BACKGROUND OF THE INVENTION

1. Field of the Invention

The present invention relates to a diagnostic circuit, and more specifically a diagnostic circuit capable of speedily detecting a failure of a plurality of function blocks connected to a bus.

2. Description of Related Art

Referring to FIG. 1, there is shown a block diagram of a conventional typical diagnostic circuit to which the present invention can be applied. Therefore, the prior art will be described with reference to FIG. 1.

In FIG. 1, Reference Numerals 1-A, ..., 1-H designate function blocks A, ..., H, respectively, and Reference Numerals 2-A, ..., 2-H indicate bus drivers for reading out data in flipflops within the function blocks A, ..., H, respectively. Furthermore, Reference Numeral 3 shows a controller for controlling a sequence of the diagnosis, and Reference Numeral 4 is indicative of a data memory for storing a correct value for the data in the flipflops within each of the function blocks in each diagnostic sequence. Reference Numeral 5 designates a comparison circuit for comparing the data in the flipflops within each function block with a corresponding correct value in the data memory 4, and Numeral 6 indicates a register for storing the result of the comparison in the comparison circuit 5 in each diagnostic sequence. Reference Numeral 7 shows a clock controller for generating a clock signal and a reset signal. The above mentioned circuits 1-A to 7 are interconnected as shown in FIG. 1.

FIG. 2 shows a circuit diagram of the function block 1-A in the prior art. Reference Numerals 1-A1, 1-A2, ..., 1-An show a flipflop, and Reference Numeral 1-A-1 designates a NAND gate for supplying a clock to a register 1-A2. The other function blocks have a similar circuit construction.

FIG. 3 is a timing chart illustrating an operation of the conventional diagnostic circuit shown in FIG. 1 with each of the function blocks 1-A, ..., 1-H being constructed as shown in FIG. 2.

The conventional diagnostic circuit operates in such a manner that, in order to diagnose the respective function blocks 1-A, ..., 1-H at each time one operating clock or necessary clock is advanced, the result of the operation of the flipflops in the respective function blocks is sequentially read out for each of the function blocks, and the read-out result is compared with the previously prepared corresponding correct value. If the result of comparison is consistency, it is deemed as normality, and if the result is inconsistency, it is deemed as abnormality. This sequential operation is controlled by the diagnostic sequence controller 3.

For one purpose of shortening the diagnostic time in the above mentioned conventional method, Japanese Patent Application Laid-open Publication No. 63-174141 proposes that, in the case that there are a plurality of circuits having the same logic construction, the plurality of the logic circuits are caused to simultaneously perform the same operation, and on the other hand, there are provided a means for simultaneously reading out the flipflops and a means for mutually comparing a plurality of read-out results.

As already mentioned, the prior art has been such that the function circuits are tested and diagnosed by advancing the operating clock by one clock or a necessary number of clocks for completing one unitary functional operation, and by comparing the result of the operation of the flipflops within the function circuits with the expected value so as to know whether or not both are consistent. Thus, since the prior art is such that at each one clock or at each time the one unitary functional operation is completed, the reading-out and comparison of the results are performed, it is disadvantageous in that the testing and diagnosing time has become long in the case that since the function circuit is large, the function circuit is divided into a considerable number of function blocks from the viewpoint of restriction in the reading-out and comparison of the results.

It is also disadvantageous in that, in the case of comparing the result of the operation with the expected value after completion of a unitary function operation, the operation condition of the flipflop during a necessary number of clocks advanced until the completion of the unitary function operation is not necessarily certainly diagnosed.

Furthermore, there has not generally been made a countermeasure for shortening the diagnosis time for a function circuit which does not include a plurality of logic circuits of the same construction

SUMMARY OF THE INVENTION

Accordingly, it is an object of the present invention to provide a diagnostic circuit which has overcome the above mentioned defect of the conventional one.

Another object of the present invention is to provide a diagnostic circuit which can shorten the diagnosis time by greatly reducing the number of the reading-out and the comparison of operation results in the course of the diagnosis.

The above and other objects of the present invention are achieved in accordance with the present invention by a diagnostic circuit comprising, for each of a plurality of function blocks obtained by dividing a function circuit, an arithmetic circuit for accumulatively calculating bit data of all flipflops in each function clock at each operation clock, a register for storing the result of the calculation in the arithmetic circuit, and a circuit for outputting data of the register as the operation result read out from the function block.

Since the operation result in all the flipflops in the function block is accumulatively calculated at all the operation clocks for each of the function blocks, the reading-out and comparison of the operation result of each function block can be made with a content certainly including an intermediate operation condition of the flipflops, not only at completion of each unitary function operation, but also at completion of a plurality of unitary function operations. Accordingly, it is possible to greatly reduce the number of the reading-out and comparison of the operation results in the course of the diagnosis. Also, it is possible to greatly reduce the capacity of a circuit for storing the correct values.

DESCRIPTION OF THE PREFERRED EMBODIMENTS

Now, the present invention will be described with reference to the drawings, which show only a portion closely relating to the present invention.

Figure 1:
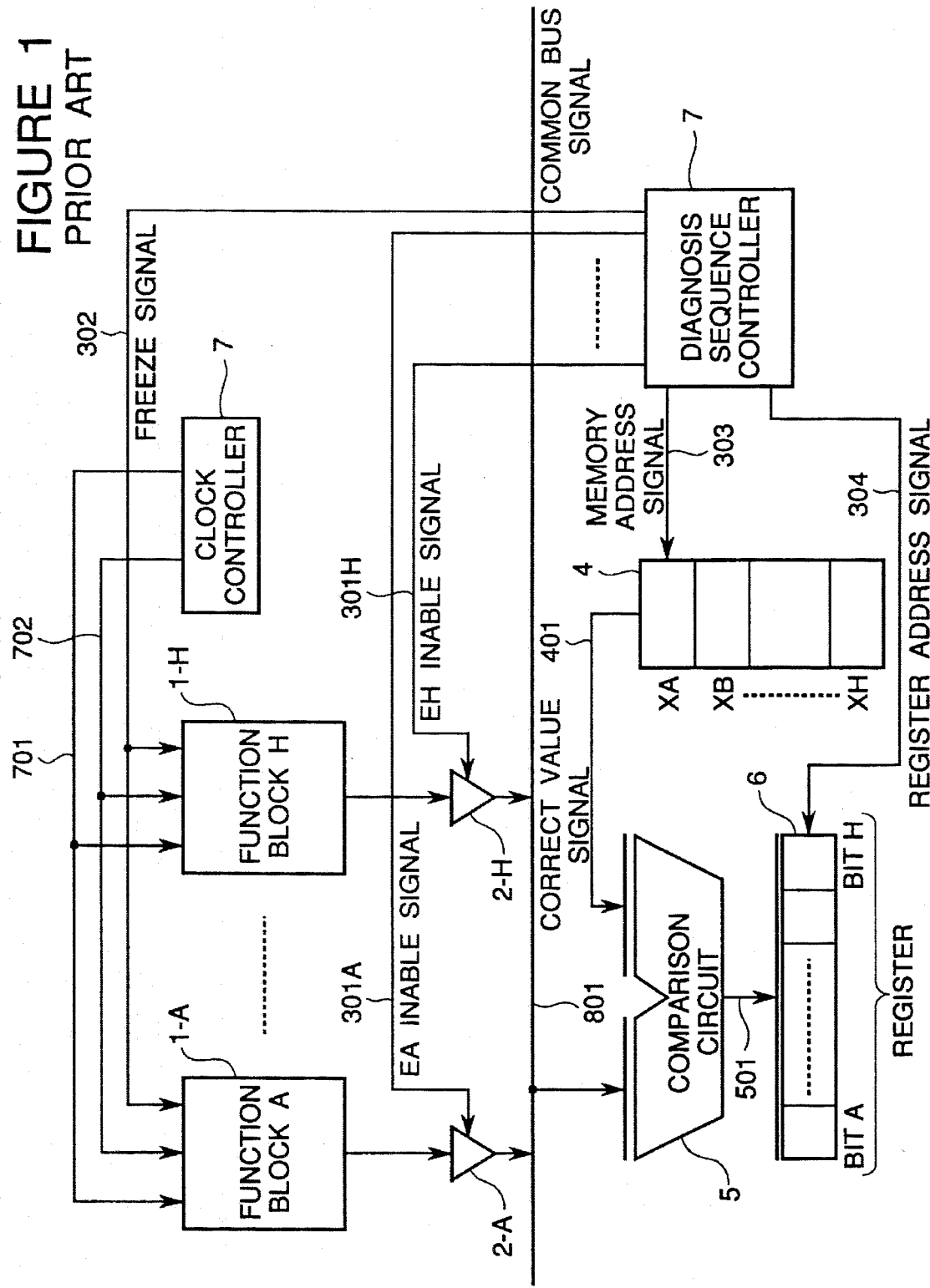
FIG. 1 is a block diagram showing a whole construction of a conventional typical diagnostic circuit to which the present invention can be applied.
Figure 2:
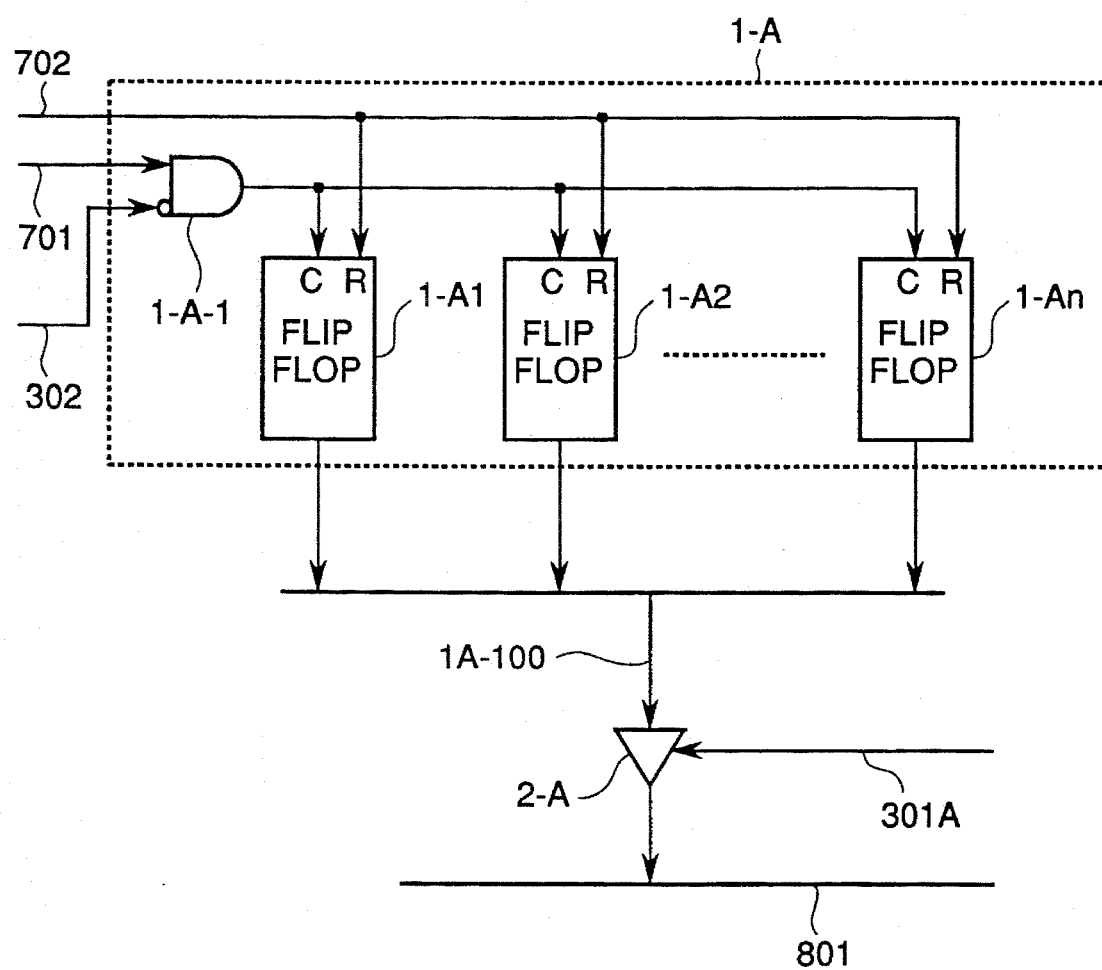
FIG. 2 is a circuit diagram of the function block in the prior art.
Figure 3:
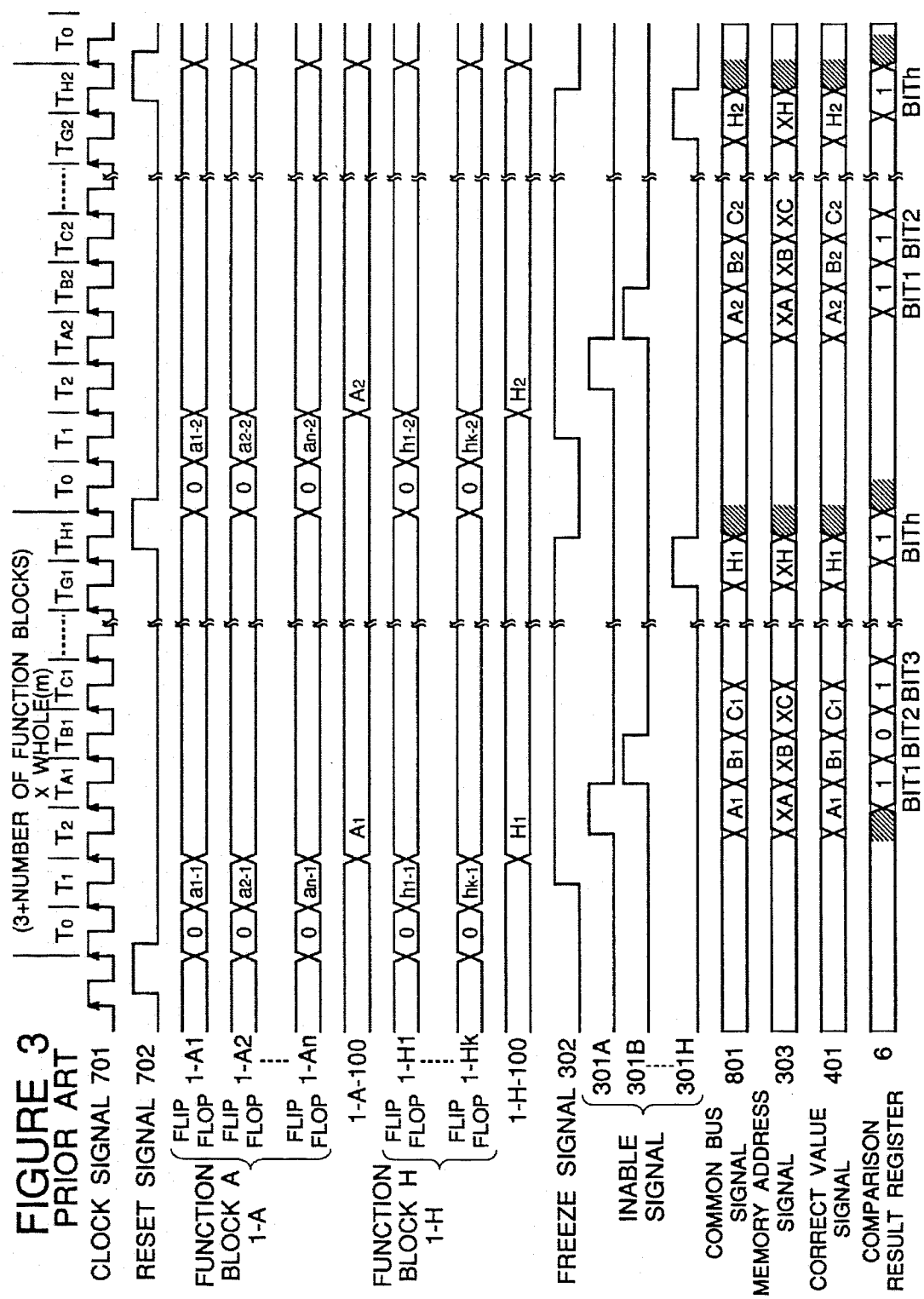
FIG. 3 is a timing chart illustrating an operation of the conventional diagnostic circuit shown in FIG. 1 with each of the function blocks being constructed as shown in FIG. 2.

FIG. 1 is a block diagram showing a whole construction of a conventional typical diagnostic circuit to which the present invention can be applied. The outline of the diagnostic circuit shown in FIG. 1 has been already described, but a detailed explanation will be made hereinafter.

In the diagnostic circuit shown in FIG. 1 to which the present invention, the function blocks 1-A, ..., 1-H are ones obtained by dividing a function circuit to be diagnosed, and coupled to common bus signal lines 801 through the bus drivers 2-A, ..., 2-H, respectively. To each of the function blocks, a clock signal 701 and a reset signal 702 are supplied from the clock controller 7, and a freeze signal 302 is applied from the diagnosis sequence controller 3.

When the diagnostic operation is started, the reset signal 702 is brought to a high level during a period of one cycle, so as to reset all of the flipflops in each function block to "0". During a next and succeeding cycles, the operation clocks become valid, so that the respective function blocks start their function diagnostic operation in parallel, and store their output, which is the result of the diagnostic operation performed in an inside of the function block itself. After the diagnostic operation has been executed and completed with a predetermined number of operation clocks, in order to read out the result of the operation of each function block, the diagnosis sequence controller 3 brings enable signals 301A, ..., 301H to a high level, during one different cycle for each one signal so as to sequentially activate the bus drivers 2-1, ..., 2-H, one at a time. Thus, data in each function block is outputted through the common bus signal lines 801 to the comparison circuit 5.

On the other hand, in order to sequentially read out the correct value data memory 4 in parallel to the reading-out of the operation results, the diagnosis sequence controller 3 changes a memory address signal 303 to "XA", ..., "XH" in the named order so that a correct value signal 401 is read out and outputted to the comparison circuit 5.

The comparison circuit 5 compares the operation result read-out data of each function block from the common bus signal lines 801, with a corresponding correct value signal 401. If both are consistent to each other, the comparison circuit 5 outputs "1" as a comparison result signal 501, and if both are inconsistent, the comparison circuit 5 outputs "0" as the comparison result signal 501. The comparison result signal 501 is written into the comparison result register 6.

At this time, an address to be written to the comparison result register 6 is indicated by the diagnosis sequence controller 3 as a bit position corresponding to the function block to be diagnosed. The above mentioned operation is repeated from the function blocks 1-A to the function block 1-H inclusive, so that the comparison result register 6 stores a normality/abnormality of the operation result of the functions blocks after the completion of the diagnostic operation.

Figure 4:
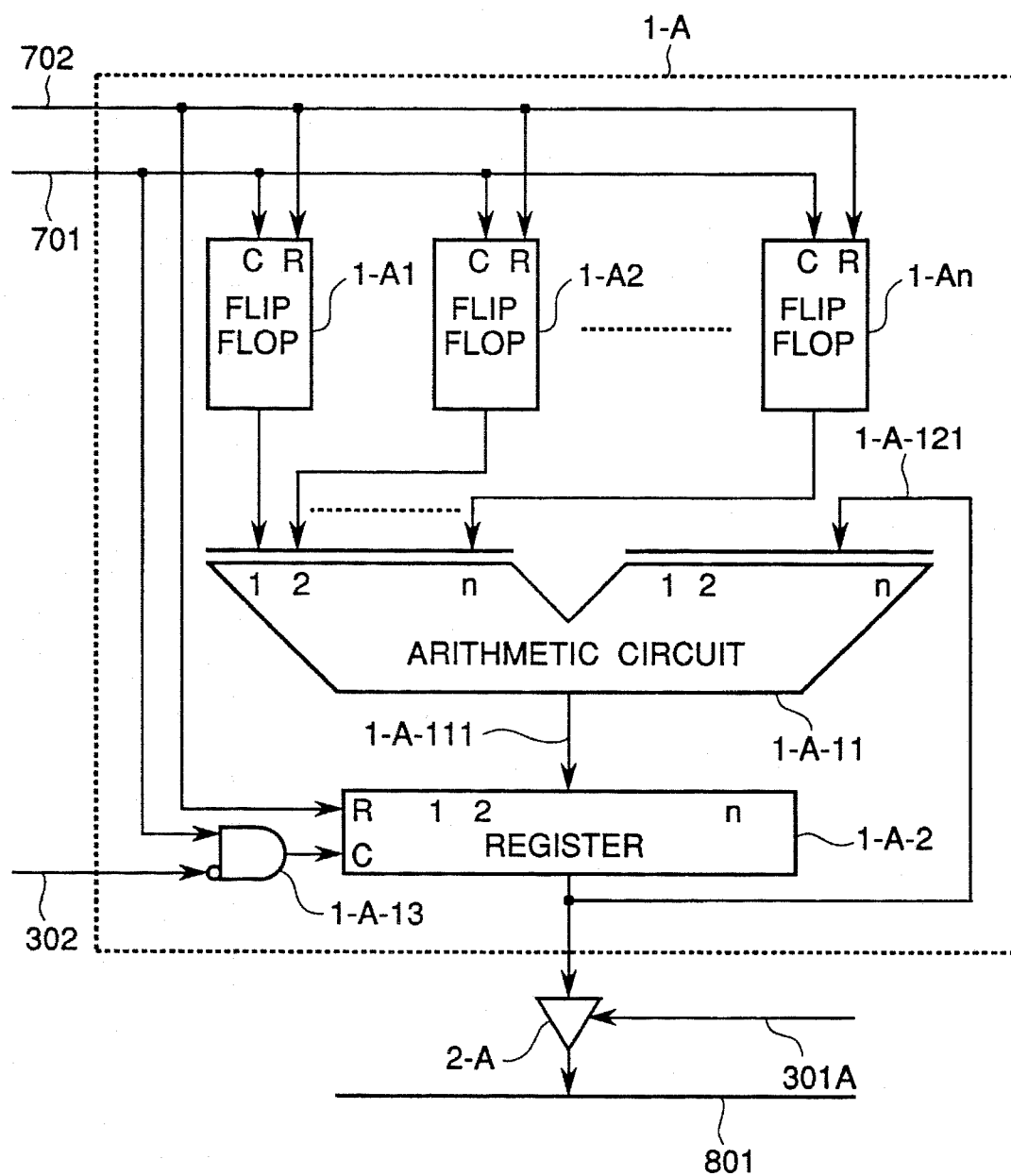
FIG. 4 is a circuit diagram of the function block in accordance with the present invention, which can be incorporated into the diagnostic circuit shown in FIG. 1.

FIG. 4 is a circuit diagram of a main part of the embodiment of the present invention. Specifically, the main part corresponds to the function blocks 1-A, ..., 1-H. Since the function blocks 1-A, ..., 1-H are constructed similarly to each other, FIG. 4 shows only the function block 1-A.

The function block 1-A includes unitary function circuits such as logic circuits, memory circuits, and others, which are to perform their function in an normal operation and which are to be diagnosed at the time of a diagnostic operation. In an example shown in FIG. 4, there are shown "n" flipflops 1-A1, 1-A2, ..., 1-An. Bit data from these flipflops is supplied to an input of an arithmetic circuit 1-A-11 which operates at the time of the diagnostic operation. The arithmetic circuit 1-A-11 performs an arithmetic operation between an output data of an arithmetic operation result register 1-A-12 and the bit data from these flipflops, and outputs its arithmetic operation result to the arithmetic operation result register 1-A-12.

Figure 5:
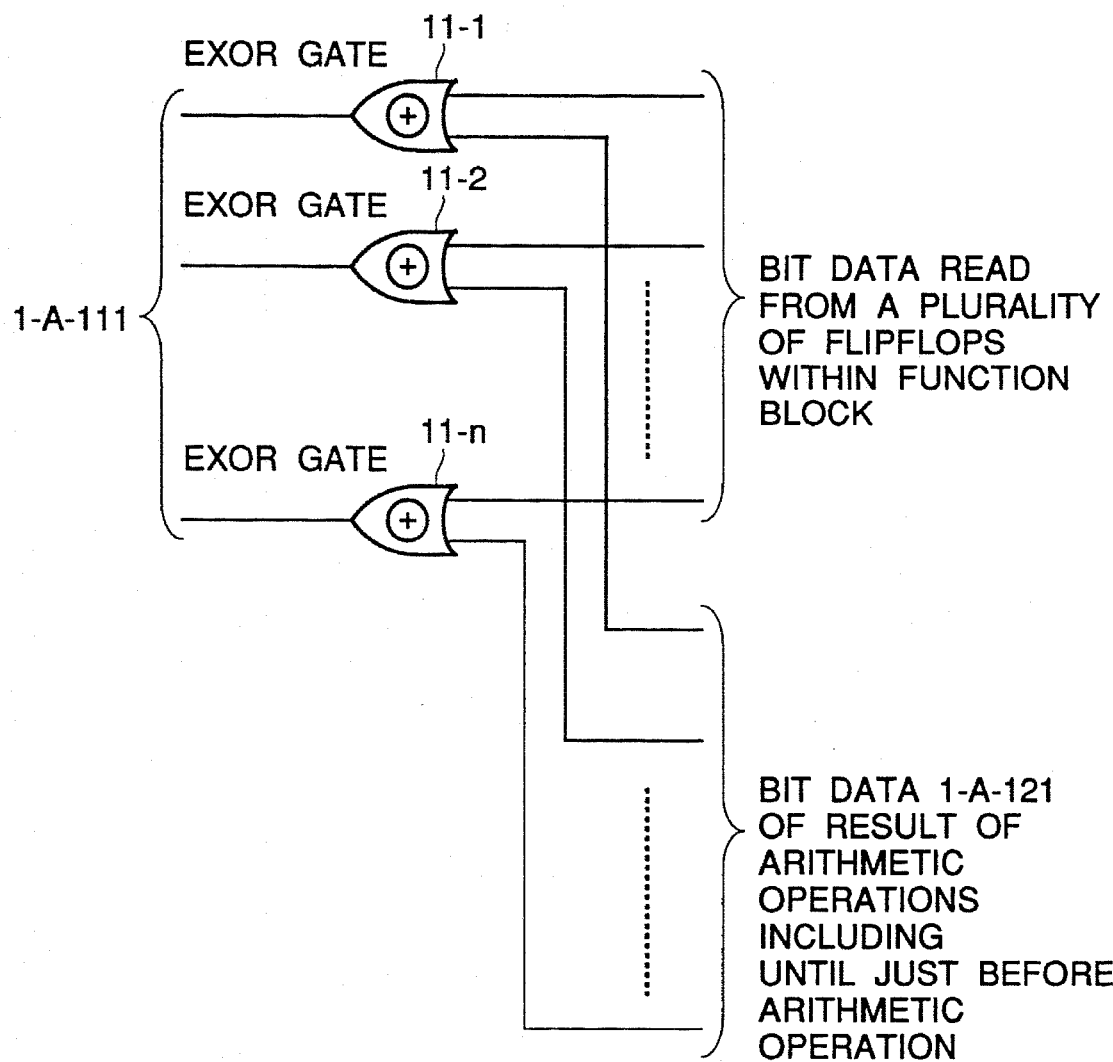
FIG. 5 is a logic circuit diagram of the arithmetic circuit shown in FIG. 4.

At the time of starting the diagnostic operation, as shown in the timing chart of FIG. 5, the arithmetic operation result register 1-A-12 is all brought to "0" in response to the reset signal 702. At a next operation clock, the arithmetic operation result register 1-A-12 is all maintained at "0" because of the result of the arithmetic operation with the content of the flipflops in a reset condition. Accordingly, at a third cycle from the starting of the diagnostic operation, a valid arithmetic operation result is written into the arithmetic operation result register 1-A-12. Thereafter, at each operation clock, the arithmetic operation between the operation result of the flipflops and an output signal 1-A121 of the arithmetic operation result register 1-A-12 are performed in the arithmetic circuit 1-A-11, and then, the result of the arithmetic operation is accumulated in the arithmetic operation result register 1-A-12.

If the function diagnostic operation is completed, the diagnosis sequence controller 3 brings the freeze signal 302 to a high level, so that a high level freeze signal 302 is supplied to all of the function blocks. In the case of the function block A, as shown in FIG. 4, the clock signal 701 is blocked by a NAND gate 1-A-13 so that the data stored in the arithmetic operation result register 1-A-12 is frozen.

Thereafter, the diagnosis sequence controller 3 sequentially outputs the EH enable signals 301A, ..., 301H to the bus drivers 2-A, ..., 2-H associated to the respective function blocks 1-A, ..., 1-H. As a result, the data stored in the arithmetic operation result registers 1-A-12, ..., 1-H-12, which is the result data of the diagnosis operation of the respective function blocks 1-A, ..., 1-H, is sequentially transferred through the common bus signal lines 801 to the comparison circuit 5.

This data transferred is compared with the data from the correct value memory as mentioned above, so that a normal function and malfunction of the respective function blocks is diagnosed.

FIG. 5 is a logic circuit diagram illustrating one example of the arithmetic circuit in accordance with the present invention. The bit data from the flipflops and the output signal 1-A121 of the arithmetic operation result register are supplied to exclusive-OR gates 11-1, 11-2, ..., 11-n, each corresponding to one bit. An output of the exclusive-OR gates is supplied to the arithmetic operation result registers 1-A-12 as an arithmetic operation signal 1-A-111. Namely, when the diagnosis operation is performed with a predetermined number of clocks, the output of the flipflops driven with these clocks is sequentially accumulatively calculated and stored by the arithmetic circuit 1-A-11 and the arithmetic operation result registers 1-A-12. In other words, the arithmetic operation results of the number corresponding to the predetermined number of clocks required to the testing of the flipflops 1-A1, 1-A2, . . . are accumulated. Therefore, if an error output signal is generated from the flipflops 1-A1, 1-A2, . . . even only one time in the course of the testing, the error is reflected in the accumulated test result, and accordingly, the final output of the arithmetic circuit 1-A-11 becomes an error. This is detected by the comparison circuit 5. Namely, the testing can be easily performed.

In this case, since the embodiment is such that as shown in FIG. 4, the arithmetic circuit 1-A-11 is composed of the exclusive-OR gates, and the capacity of the arithmetic operation result registers 1-A-12 for holding the output of the arithmetic circuit 1-A-11 is made the same as the number of the corresponding flipflops 1-A1, 1-A2, . . . , 1-An, namely, "n", it is possible to prevent the circuit construction from becoming complicated. On the other hand, however, if the number of clocks required to the testing is set to be large, there may occur such a situation from a viewpoint of probability that, in the course of the testing, the flipflops 1-A1, 1-A2, . . . , 1-An generate an error output to the arithmetic circuit 1-A-121 several times but the final output of the arithmetic circuit 1-A-121 happens to become correct, with the result that it is not possible to detect the error.

However, this probability is sufficiently small, and therefore, reliability of the testing circuit is practically not lost. But, when it is desired to set the number of the above mentioned testing clocks to a large value, the following way can be adopted: The capacity of the registers 1-A-12 for holding the output of the arithmetic circuit is made large. In addition, the exclusive-OR gate in the arithmetic circuit is replaced with a circuit for calculating a sum between an output from the flipflop 1-A1 and the others (called a "first output" hereinafter) and another output from the registers 1-A-12 and the others (called a "second output" hereinafter) and also sequentially accumulating the result of the summing. Alternatively, there is adopted a circuit for adding the first output with a special value determined for the testing, and then for calculating a sum between the added first output and the second output.

In the case of adopting these arithmetic operations, the result of the arithmetic operations becomes larger than the "n" bits mentioned above. However, by selecting only special bits of the result of the arithmetic operations and outputting the selected special bits as the n-bit value to the register 1-A-12, it is possible to prevent the register 1-A-12 from becoming complicated. In addition, in a testing operation corresponding to a very large set number of clocks, it is possible to avoid an oversight of the error, and therefore, to prevent drop of the reliability.

Figure 6:
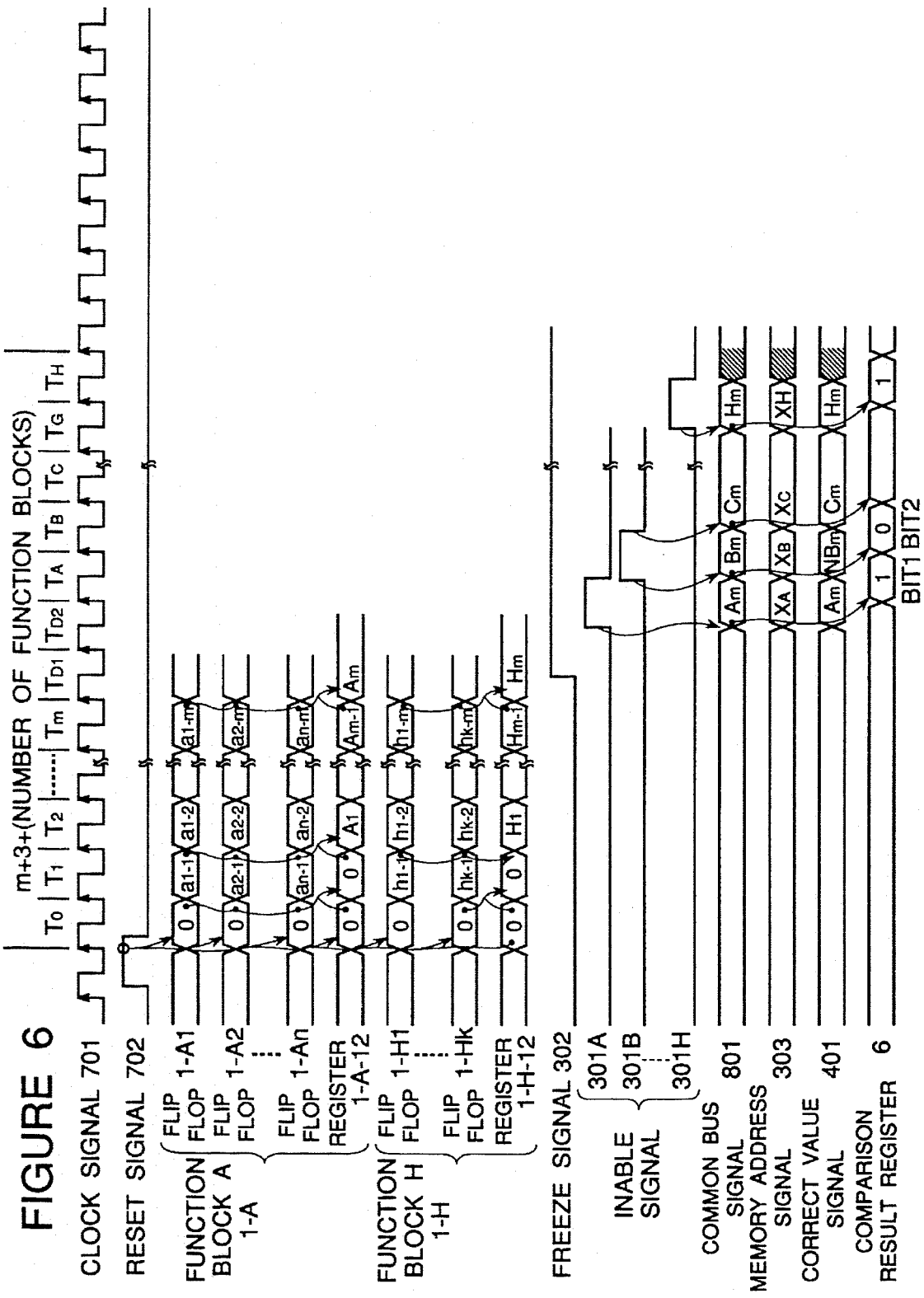
FIG. 6 is a timing chart illustrating an operation of the conventional diagnostic circuit shown in FIG. 1 with each of the function blocks being constructed as shown in FIG. 4.

FIG. 6 is an operation timing chart of the one embodiment of the present invention. The detail of the operation is as mentioned above. Assuming that the diagnosis operation is completed at an "m"th clock, the number of clocks required for the diagnosis becomes {m+3+"number of function blocks"}. This means that, the diagnosis time can be remarkably shortened, in comparison with {(3+"number of function blocks")×m}, which is required when the reading-out and comparison of the function blocks are performed at each operation clock by not using the present invention. In particular, if "m" is sufficiently large, assuming that the number of function blocks is "f", it is expected that the diagnosis time can be shortened to one-divided-by-"f".

As mentioned above, the diagnostic circuit in accordance with the present invention comprises, for each of a plurality of function blocks obtained by dividing a function circuit, an arithmetic circuit for accumulatively calculating bit data of all flipflops in each function clock at each operation clock, a register for storing the result of the calculation in the arithmetic circuit, and a circuit for outputting data of the register as the operation result read out from the function block.

With this arrangement, it is possible to diagnose the result of the function operation in the form certainly including the operation conditions of the flipflops at every clocks, and also, it is possible to greatly reduce the number of the reading-out and comparison of the operation results in the course of the diagnosis. For example, if the number of diagnostic clocks is sufficiently large, assuming that the number of function blocks is "f", it is expected that the diagnosis time can be shortened to one-divided-by-"f". In addition, assuming that the number of diagnostic clocks is "m", the capacity of the correct value data memory can be reduced to one-divided-by-"m" at maximum.

I claim:

1. A functional operation diagnostic circuit for diagnosing an operation a circuit in which a plurality of function blocks each including a plurality of flipflops are connected to a common bus, said function blocks being sequentially selected by a diagnosis sequence controller so that data is read out from the function blocks and compared with previously prepared correct value data, characterized in that the diagnostic circuit comprises, for each of said blocks, an arithmetic circuit for accumulatively calculating bit data of all flipflops in each function clock at each operation clock, a register for storing the result of the calculation in the arithmetic circuit, and a circuit for outputting data of the register as the operation result read out from the function block.

2. A diagnostic circuit comprising a plurality of function blocks selectively connected to common bus lines and each including a plurality of unitary function circuits, a control circuit for supplying a first control signal to each of said function blocks, each of said function blocks including an arithmetic circuit having a first input connected to said plurality of unitary function circuits and a register having an input connected to an output of said arithmetic circuit and an output connected to a second input of said arithmetic circuit, characterized in that said plurality of unitary function circuits are configured to continuously output a plurality of output signal in response to said first control signal, and said register holds the output of said arithmetic circuit in response to said first control circuit so as to supply the hold data to the second input of said arithmetic circuit.

* * * * *